United States Patent [19]
Wulff

[11] 3,949,187
[45] Apr. 6, 1976

[54] ELECTRON-BEAM EVAPORATION APPARATUS

[75] Inventor: Günther Wulff, Trubbach, Switzerland

[73] Assignee: Balzers Patent und Beteiligungs AG, Liechtenstein

[22] Filed: May 17, 1974

[21] Appl. No.: 471,134

[30] Foreign Application Priority Data
May 26, 1973  Switzerland.................... 7602/73

[52] U.S. Cl. ............ 219/121 EB; 118/49.1; 324/33
[51] Int. Cl.² ........................................ C23C 13/12
[58] Field of Search ............ 118/5, 7, 8, 49.1, 49.5; 117/93.2, 93.3; 324/33; 219/121 EB

[56] References Cited
UNITED STATES PATENTS

| | | | |
|---|---|---|---|
| 3,046,936 | 7/1962 | Simons, Jr. ......................... | 118/49.1 |
| 3,390,249 | 6/1968 | Hanks ......................... | 118/49.5 UX |
| 3,651,781 | 3/1972 | Brill et al. .................... | 118/49.5 UX |
| 3,690,635 | 9/1972 | Harker et al. .................. | 118/49.1 X |
| 3,756,193 | 9/1973 | Carmichael et al. ............... | 118/49.1 |

OTHER PUBLICATIONS

*Research Development*, "Gas–Scattering and Ion Plating Deposition Methods" Kennedy et al., Vol. 22, No. 11, pp. 40–44.

*Primary Examiner*—Morris Kaplan
*Attorney, Agent, or Firm*—McGlew and Tuttle

[57] ABSTRACT

An apparatus for electron-beam evaporation comprises a holding structure or support for the substance to be evaporated arranged alongside a hot cathode. A focusing and accelerating electrode is located adjacent the hot cathode and acts on the electrons emitted thereby. Means are provided for generating a magnetic field in the electron flow path in order to deviate the electrons to the substance. An ion-collecting electrode is located adjacent the hot cathode for collecting the ions formed in the vapor beam during the evaporation. The substance to be evaporated, the means for producing the electron beam and the ion-collecting electrode are all arranged in order one after the other in the magnetic field.

4 Claims, 3 Drawing Figures

ELECTRON-BEAM EVAPORATION APPARATUS

BACKGROUND OF THE INVENTION

1. Field of the Invention

This invention relates in general to the construction of devices for evaporating substances and, in particular, to a new and useful device for electron-beam evaporation.

2. Description of the Prior Art

The present invention relates to a device for electronbeam evaporation, comprising a holding structure for the substance to be evaporated, a hot cathode, a focusing and an accelerating electrode for the electrons emitted by the cathode, and means for generating a magnetic guide field deviating the electrons to the substance to be evaporated, with an ion-collector being provided for collecting the ions formed in the vapor beam during the evaporation. Such devices are used for the vacuum depositing of thin layers. In most cases, it is necessary to control the evaporation rate during the deposit, that is, the quantity of evaporating substance which is evaporated from the evaporation source during a given period of time, for example, a second, divided by this period of time. The evaporation rate is decisive for the evaporation velocity or the so-called coating rate, i.e., the quantity of layer substance deposited on the substrate during a period of time divided by this period of time. Frequently, a physical quantity depending on the coating rates is measured, for example, the increase in thickness of the layer or the frequency variations of a quartz resonator exposed to the vapor beam, and used as a measure for the coating rate and also for the evaporation rate.

The accurate and rapid measuring of the evaporating rate is important primarily in cases where this measurement has to serve as a basis for controlling the evaporation capacity of the vapor source in conformity with the requirements of the evaporation process, for example, for keeping this capacity constant or for varying the same in time in accordance with a predetermined program. The last-named control may be necessary, for example, for depositing a layer having a refraction gradient.

A device for the continuous measuring of the evaporation rate is known which includes an ion-detector projecting into the zone of the vapor beam and supplied with a constant direct current for furnishing a test-current depending on the vapor beam density and thereby affecting the evaporation rate. With the ion-detector located in the vapor beam, this device has the disadvantage of intercepting a part of the vapor and throwing a vapor-beam shadow on the object to be coated by evaporation. However, to eliminate this shadow formation, the ion-collecting electrode may be disposed off the vapor-sourceobject path, vapor-source/object example, closely adjacent the object to be coated.

Nevertheless, experience has shown that surprisingly, such ion-detectors located in the space above the evaporation source do not offer the desired accuracy and reproducibility of measurement to be expected. That is, after a prolonged use of such a detector, the observation is made that at the same evaporation rate and under otherwise apparently entirely equal conditions, nature of the evaporated substance, residual gas pressure, voltage applied to the detector, measured values are obtained differing from the initial values.

SUMMARY OF THE INVENTION

The invention provides a new arrangement for carrying out rate measurements more accurately and with a greater sensitivity than with the hitherto known ion current measuring devices. The inventive device is characterized in that the ion-collecting electrode is located alongside the substance to be evaporated, approximately at the same level thereof, and off the vapor beam.

Aside from the higher sensitivity, the inventive arrangement has the further advantage that the ion-collecting electrode is preferably situated below a screen for a temporary interruption of the vapor flow from the vapor source to the objects to be coated, whereby, the evaporation rate can be measured independently of the actual position of such a screen.

Accordingly, it is an object of the invention to provide an electron-beam evaporation device which includes a holding structure for the substance to be evaporated located alongside a hot cathode having means for focusing and accelerating the electrode which are emitted thereby, and which also includes means for generating a magnetic field in the electron flow path for deviating the electrons to the substance to be evaporated and an ion-collecting electrode for collecting the ions which are formed in the vapor beam during the evaporation, the substance to be evaporated, the means for producing the electron beam and the ion-collecting electrode being arranged in the magnetic field.

A further object of the invention is to provide an electron beam evaporation device which is simple in design, rugged in construction, and economical to manufacture.

The various features of novelty which characterize the invention are pointed out with particularity in the claims annexed to and forming a part of this disclosure. For a better understanding of the invention, its operating advantages and specific objects attained by its uses, reference should be had to the accompanying drawings and descriptive matter in which there is illustrated a preferred embodiment of the invention.

DESCRIPTION OF THE PREFERRED EMBODIMENT

Figure 1:
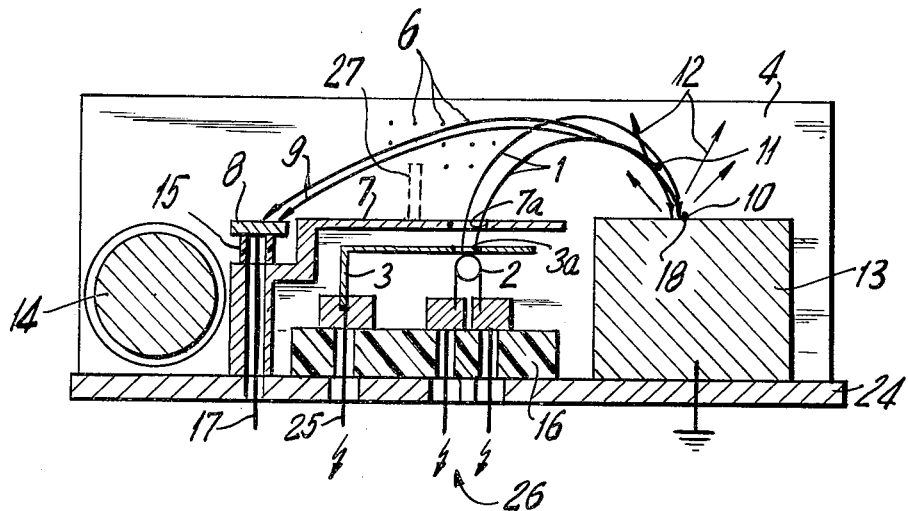
FIG. 1 is a longitudinal sectional view of a device for evaporating a substance constructed in accordance with the invention.
Figure 2:
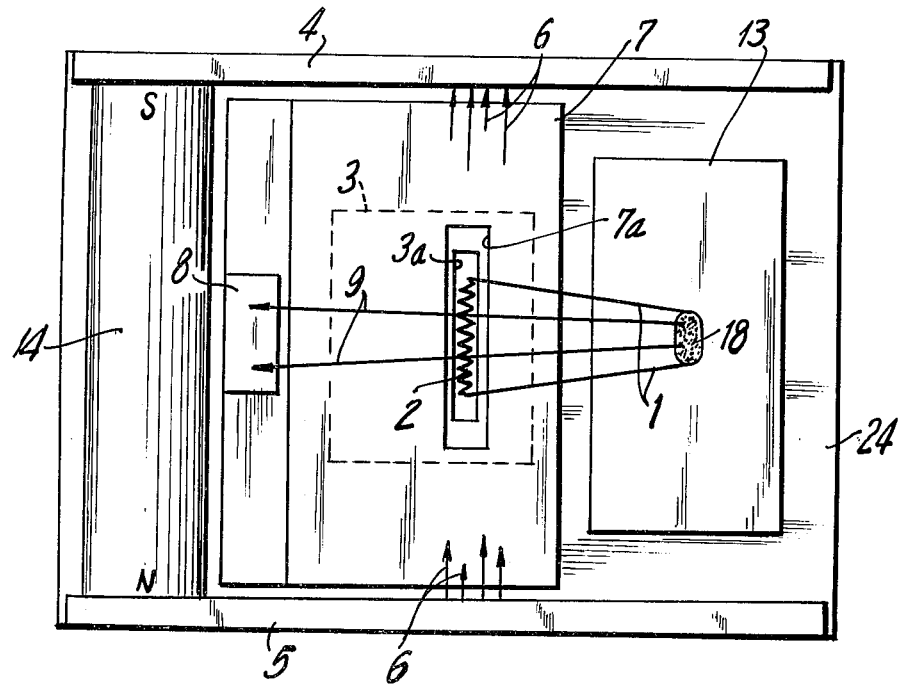
FIG. 2 is a top plan view of the apparatus shown in FIG. 1.

Referring to the drawings in particular, the invention embodied therein, comprises an electron-beam evaporation device which includes a baseplate 24, which provides a support for a substance 13, to be evaporated, alongside a hot cathode 2. The electrons emitted by the hot cathodes to pass through a slot 7a of an accelerating electrode 7. After passing through a slot 3a, of a focusing electrode 3, which slots extend parallel to the longitudinal axis of the cathode.

In accordance with the invention, the electron beams are deviated to the substance 13 by a magnetic field 6 which is set up between pole faces 4 and 5 placed on each end of an excitation winding for generating the magnetic field 14. The intensity of the magnetic field and the operating voltage of the electrodes are chosen so that the electron beam 1 forms a crossover on the surface of the substance 13 at the location 18. The power density produced by the electronbeam has its maximum at this point, which is equal to the product of the beam current density times the acceleration voltage, and it causes substance 13 to fuse and evaporate.

Due to the incident electron beam, a part of the evaporation atoms or molecules are ionized and the ions thus produced are deviated by the magnetic field 6 and they partly impinge upon an ion-collecting electrode 8. The ion electrode 8 is preferably provided with a Faraday cage in order to reduce the disturbing influences of any secondary electrons. The charge of the impinging ions is conducted as a measuring current through a line 17 to an ammeter. The test current derivable from the ion-collector is a well defined monotonous function of the evaporation rate as can be proved by comparison with a rate determined by means of an accurate quartz resonator for measuring the layer thickness. The ionic test current depends not only on the evaporation rate but also on the area and potential of the collecting surface, the nature of the vapor, the acceleration voltage for the electron beam, and the residual gas. These factors can all be taken into account at the calibration of the device or at the conversion of the ionic test current to the evaporation rate.

In the drawing, the ion path is indicated by the rays 9 passing through magnetic field 6. The numeral 10 indicates the ionization point close to the surface of the substance to be evaporated. The ionization point of the electron beam is indicated at 11, and the evaporated atoms or molecules are indicated at 12.

The collecting electrode 8 is supported by an insulator 15 and a high-tension insulator 16 supports the focusing electrode 3 and the hot cathode 2. A lead-off 17 extends from the ion-collecting electrode and provides a means for connecting an ammeter for measuring the current furnished by the ion electrode.

Figure 3:
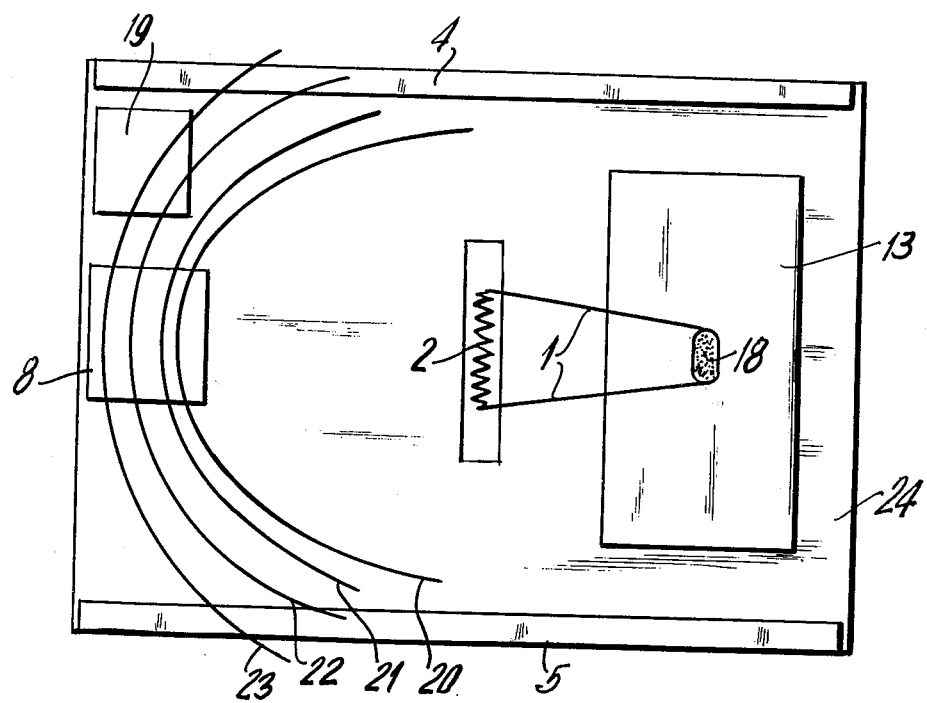
FIG. 3 is a view similar to FIG. 2 indicating the location of equal ionic current density for different levels of the molten bath pool.

In the embodiment of FIG. 3, an additional ion electrode 19 may be provided and, in this drawing, the rays 20, 21, 22 and 23 indicate the loci of the constant ionic current density for four different levels of the evaporation surface of the evaporating substance. High-voltage lead-ins 25 and 26 are provided for the focusing electrode 3 and the hot cathode 2. In some instances, a screen wall 27 is provided over the accelerating electrode 7.

In the following table, the first column shows the evaporation rate for different evaporating substances found during a test (and checked by means of a quartz-resonator rate meter located at a distance of 40 cm from the vapor source), in nanometers per second. The next column indicates the ionic current obtained with the inventive device for the same evaporation with an ion-collecting area of the electrode 8 of 2 cm² as well as the collector potential used in this connection. This potential must be negative if (as usual) positively charged ions are to be determined, and positive for the collection of negative ions.

| MATE-RIAL | RATE | IONIC CURRENT | COLLEC-TOR-POTENTIAL | |
|---|---|---|---|---|
| Al | 60 A/s | 0,4 mA | 200 V | < 30 µA |
| Fe | 50 A/s | 0,6 mA | 200 V | < 2 µA |
| Ta | 30 A/s | 0,7 mA | 200 V | < 3 µA |
| Al$_2$O$_3$ | 30 A/s | 0,005 mA | 50 V | < 0,5 µA |

The last column shows the residual ionic current which has been measured without the evaporating substance and at the same electron-beam intensities as in the case of the above-mentioned evaporations at a pressure of the residual gas in the evaporation chamber of $10^{-5}$ torr, and which is based on the ions formed in the residual gas. The residual ionic current is of the order of magnitude of microamperes, thus substantially smaller than the test current occurring at the evaporation.

In accordance with the invention, the guide field for the electron beam, as described, is simultaneously used for leading the ionic beam to the collecting electrode. Such a guide field limits the spatial distribution of the ionic current; it acts in the manner of reproducing the evaporating surface of the substance within a certain space of the evaporation chamber and it is advantageous to locate the ion-collecting electrode just in the zone of this "reproduction" as it is the case with the arrangement according to FIG. 1. That is, the ionic current density in this zone is substantially higher than in any other place of the evaporation chamber. Thereby, the measuring sensitivity of the inventive device can be considerably increased. In known devices, on the contrary, a great part of the produced ions frequently does not reach the ion collector because this part is deviated by the magnetic field. That is why, in these devices, ionic currents are obtained which are smaller than those obtained with the inventive arrangement.

Further examinations have shown that the accurate reproducibility of the measurements, according to the invention, is probably due to the fact that, in contrast to the known arrangements in which the ion-detector is exposed to the vapor beam, the ion-collecting surface of electrode 8 gets a definite area and maintains the same during the whole measurement, through the measuring operation itself. Due to the impingement of ions upon the surface of electrode 8, a firmly adherent layer is formed thereon (in a similar manner as in the ion plating) resulting in a definite surface quality, particularly, a uniform secondary electron emission. The last-mentioned circumstance is of particular importance because by the secondary electrons which are released on the electrode surface by the ions, the test current flowing through line 17 is varied. The known detector arrangements also cause a coating of the electrode surface. However, in these cases, neutral vapor particles are primarily deposited, forming a surface which grows rougher with the increasing layer thickness (approximately from 1 µm upwards) and results in a poorly defined non-uniform secondary electron emission. On the contrary, the layer formed on the collecting electrode 8 by the ion discharge can attain a thickness of 1/10 mm without thereby affecting the accuracy of measurement.

In order to securely avoid a coating of the ion-collecting electrode with neutral vapor particles, it is recommended in the inventive device that the electrode be located off of a conical space, the apex of which coincides with the crossover 18 of the electron beam situated on the surface of the evaporating substance and the generated surface of which is determined by a straight generatrix forming an angle of 60° with the perpendicular to the surface of the substance to be evaporated. Preferably, the surface of the ion-collecting electrode is approximately positioned in the plane determined by the evaporating surface of the substance 13 or even below this plane. If necessary, a screen wall may be provided in addition between the ion-collecting electrode and the evaporating surface, which screen does not disturb the travel of the ions along their path 9, however, but protects the ion-collector surely against coating. This possibility is indicated in FIG. 1 at 27 in broken lines.

As already mentioned, the value of the ionic test current also depends on the position of the evaporating surface. This can be utilized for simultaneously controlling the position of this surface, for example, the level of the molten bath pool in an evaporation crucible, during the evaporation. Another ion collector 19 is advantageously provided to this end, as shown in FIG. 3. The curves 20 to 23 indicate the loci of equal ionic current density for different levels of the molten bath pool. These curves show that the ionic current derivable from the ion-collecting electrode 19 is largely dependent on the mentioned level while the ionic current passing to electrode 8 is substantially less dependent thereon. The arrangement may be provided so that the electrode 8 is used for the measuring of the evaporation rate substantially independently of the bath pool level and the electrode 19 is used for controlling the level.

While a specific embodiment of the invention has been shown and described in detail to illustrate the application of the principles of the invention, it will be understood that the invention may be embodied otherwise without departing from such principles.

What is claimed is:

1. A device for electron beam evaporation, comprising a holding structure for the substance to be evaporated, a hot cathode spaced from said holding structure, a focussing and accelerating electrode adjacent said hot cathode acting on electrons emitted by said hot cathode, means for generating a magnetic field in the electron flow path for deviating the electrons to the substance, and an ion-collecting electrode for collecting the ions formed in the vapor beam during evaporation and spaced from said hot cathode on the side thereof opposite to said holding structure side and off the vapor beam and disposed in the magnetic field, the substance to be evaporated, said means for producing the electron beam, and said ion collecting electrode all being arranged in order one after the other in said magnetic field.

2. A device for electron-beam evaporation, according to claim 1, wherein said hot cathode is disposed with its longitudinal direction parallel to the magnetic deviation field.

3. A device for electron-beam evaporation, according to claim 1, wherein said means for generating a magnetic field include a pole face arranged in spaced opposing relationship on each side of said cathode, said collecting electrode being located in the middle plane therebetween and at the same level as the evaporating plane of the substance.

4. A device for electron-beam evaporation, according to claim 1, including a second ion-collecting electrode located at a location removed from the middle plane of said hot cathode.

* * * * *